(12) United States Patent
Ferrant et al.

(10) Patent No.: US 7,068,533 B2
(45) Date of Patent: Jun. 27, 2006

(54) RESISTIVE MEMORY CELL CONFIGURATION AND METHOD FOR SENSING RESISTANCE VALUES

(75) Inventors: Richard Ferrant, Esquibien (FR); Arkalgud Sitaram, Wappingers Falls, TX (US)

(73) Assignees: Infineon Technologies AG, Munich (DE); Altis Semiconductor, Corbeil Essonnes (FR)

( * ) Notice: Subject to any disclaimer, the term of this patent is extended or adjusted under 35 U.S.C. 154(b) by 0 days.

(21) Appl. No.: 10/955,832

(22) Filed: Sep. 30, 2004

(65) Prior Publication Data

US 2006/0067103 A1 Mar. 30, 2006

(51) Int. Cl.
*G11C 11/00* (2006.01)
*G11C 11/14* (2006.01)

(52) U.S. Cl. .................. 365/158; 365/171; 365/173
(58) Field of Classification Search ........... 365/158, 365/171, 173
See application file for complete search history.

(56) References Cited

U.S. PATENT DOCUMENTS

| | | | |
|---|---|---|---|
| 6,778,429 B1 * | 8/2004 | Lu et al. | 365/158 |
| 6,791,865 B1 * | 9/2004 | Tran et al. | 365/158 |
| 6,801,471 B1 * | 10/2004 | Viehmann et al. | 365/171 |
| 6,809,981 B1 * | 10/2004 | Baker | 365/158 |
| 6,839,269 B1 * | 1/2005 | Iwata et al. | 365/158 |
| 6,839,274 B1 * | 1/2005 | Jang et al. | 365/171 |
| 6,909,631 B1 * | 6/2005 | Durlam et al. | 365/158 |
| 6,930,912 B1 * | 8/2005 | Inui | 365/158 |
| 6,944,049 B1 * | 9/2005 | Hoenigschmid et al. | 365/158 |
| 6,950,334 B1 * | 9/2005 | Shimizu et al. | 365/171 |

* cited by examiner

*Primary Examiner*—Trong Phan
(74) *Attorney, Agent, or Firm*—Dicke, Billig & Czaja PLLC

(57) ABSTRACT

A configuration of resistive memory cells is disclosed. In one embodiment, the configuration of resistive memory cells comprises a plurality of first current lines; a plurality of second current lines; and a plurality of third current lines. A plurality of resistive memory cells being disposed in a memory matrix form between said first and second current lines, said first current lines defining the columns of said memory matrix form, while said second current lines defining the rows of it, wherein each one of the resistive memory cells being connected to one of said first current lines; a plurality of selection transistors having gates and drain-source paths, each drain-source path of said selection transistors being connected to a multiplicity of the resistive memory cells of a row of said memory matrix, said drain-source paths of different selection transistors being connected to a fourth current line (SL), the gates of said selection transistors of a row of said memory matrix form being connected to one of said third current lines. It further relates to a method for sensing the resistance values of a selected resistive memory cell.

20 Claims, 3 Drawing Sheets

RESISTIVE MEMORY CELL CONFIGURATION AND METHOD FOR SENSING RESISTANCE VALUES

FIELD OF THE INVENTION

This invention is in the field of non-volatile semiconductor memory chips and more particularly relates to a configuration of resistive memory cells, particularly an MRAM-configuration comprising magneto-resistive memory cells, and a method for sensing the resistance values (reading of logic states) of selected memory cells of the configuration.

BACKGROUND

Magnetic (or magneto-resistive) random access memory (MRAM) is a non-volatile access memory technology that could potentially replace the dynamic random access memory (DRAM) as the standard memory for computing devices. Particularly, the use of MRAM-devices as a non-volatile RAM will eventually allow for "instant on"-systems that come to life as soon as the computer system is turned on, thus saving the amount of time needed for a conventional computer to transfer boot data from a hard disk drive to volatile DRAM during system power up.

A magnetic memory cell (also referred to as a tunneling magneto-resistive or TMR-device) includes a structure having ferromagnetic layers separated by a non-magnetic layer (barrier) and arranged into a magnetic tunnel junction (MTJ). Digital information is stored and represented in the magnetic memory cell as directions of magnetization vectors in the ferromagnetic layers. More specifically, the magnetic moment of one ferromagnetic layer is magnetically fixed or pinned (also referred to as a "reference layer"), while the magnetic moment of the other ferromagnetic layer (also referred to as "free layer") is free to be switched between the same and opposite directions with respect to the fixed magnetization direction of the reference layer. The orientations of the magnetic moment of the free layer are also known as "parallel" and "antiparallel" states, respectively, wherein a parallel state refers to the same magnetic alignment of the free and reference layers, while an antiparallel state refers to opposing magnetic alignments therebetween.

Depending upon the magnetic states of the free layer (i.e., parallel or antiparallel states), the magnetic memory cell exhibits two different resistance values in response to a voltage applied across the magnetic tunnel junction barrier. The particular resistance of the TMR-device thus reflects the magnetization state of the free layer, wherein resistance is "low" when the magnetization is parallel, and "high" when the magnetization is antiparallel. Accordingly, a detection of changes in resistance allows a MRAM-device to provide information stored in the magnetic memory element, that is to say to read information from the magnetic memory element. In addition, a magnetic memory element typically is written to through the application of a bi-directional current in a particular direction, in order to magnetically align the free layer in a parallel or antiparallel state.

An MRAM-configuration integrates a plurality of magnetic memory cells and other circuits, such as a control circuit for magnetic memory elements, comparators for detecting states in a magnetic memory element, input/output circuits and miscellaneous support circuitry. The magnetic memory cells are designed to be integrated into the back end wiring structure of back-end-of-line (BEOL) CMOS methoding following front-end-of-line (FEOL) CMOS methoding.

To be useful in present day electronic devices, very high density arrays of magnetic memory cells are utilized in magnetic random access memories. In these high density arrays the magnetic cells are generally arranged in rows and columns, with individual cells being addressable for reading and writing operations by the selection of an appropriate row and column containing the desired cell. Also conveniently, orthogonal current lines are provided, one for each row and one for each column so that a selected cell is written by applying current to the appropriate row current line and the appropriate column current line.

Recently, and especially in view of modern portable equipment, such as portable computers, digital still cameras and the like, the demand of low-cost and particularly high-density mass storage memories has increased dramatically. Therefore, one of the most important issues for low-cost and high-density MRAM-devices is a reduction of the MRAM-cell size.

In their simplest embodiment, an MRAM-configuration comprising memory cells in a memory matrix between bit and word lines, in a completely ideal manner require only an area of $4F^2$ per information content or bit, where F denotes the minimum feature size of the technology used. Such configuration, however, will suffer from considerable parasitic currents flowing through adjacent memory cells during read-out on account of the only slight differences in the resistance values of the memory cells. In order to avoid this disadvantage more sophisticated configurations have already been envisioned, in which each individual memory cell contains an MTJ and a selection transistor. What is disadvantageous about this configuration, however, is that the advantage of a high-density configuration is lost. More particularly, since the bottom electrode of each MTJ has to be connected to the corresponding selection transistor through a succession of vias, contacts and metal landing pads, and, on account of the fact, that these landing pads need to have a large contact area with respect to minimum feature size F, as has been shown, in practical realization, there is no possibility to achieve a memory cell size below an area of 20–25 $F^2$.

In order to resolve the above conflict between reduced area requirements in terms of minimum feature size F, on the one hand, and avoidance of parasitic currents, on the other hand, sharing of one selections transistor between several MTJs, for example, has been proposed. However, this solution may not be employed for MRAMs, since the storage signal cannot be mixed. Another solution, which has been previously proposed, envisions deep, especially self-aligned, vias running from the bottom electrode of the MTJ to the drain of the selection transistor, which, however, is a rather expensive technique, and, most likely will require long method development to be ready for mass production.

SUMMARY

Embodiments of the present invention provide resistive memory cell configuration and method for sensing resistance values, suitable for use in MRAM devices, and devices including MRAM devices.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
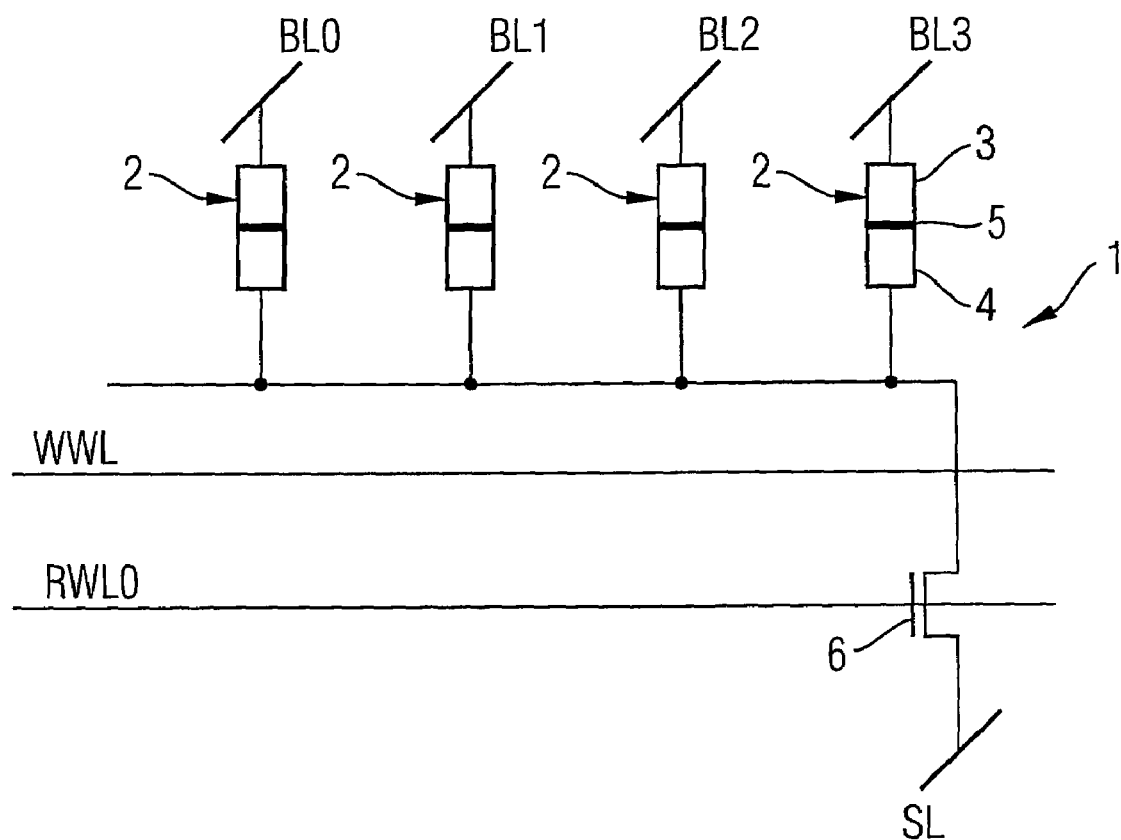
FIG. 1 is a schematic perspective partial view illustrating one embodiment of an MRAM configuration of the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a configuration of resistive memory cells, particularly an MRAM-configuration, allowing a further memory cell size down-scale as compared to convenient 1T/1MTJ-arrangements, without having adverse effects as to parasitic currents.

According to embodiments of the invention, the above is attained by a configuration of resistive memory cells, which comprises a plurality of first current lines, which may be identified by bit lines (BL), a plurality of second current lines, which may be identified by write word lines (WWL), a plurality of third current lines, which may be identified by read word lines (RWL), a plurality of resistive memory cells and a plurality of selection transistors. In this specification, the term "resistive memory cell" is used to describe memory cells of any kind, which can be brought into two or more states exhibiting different electrical resistance values, such as magneto-resistive memory cells including magnetic tunnel junctions as used in convenient MRAMs, phase change memory cells and conductive bridging memory cells.

In above configuration, the resistive memory cells are disposed in a memory matrix form between the first and second current lines, in which memory matrix the first current lines define its columns, while the second current lines define the rows of it. Each one of the resistive memory cells is connected to a separate one of the first current lines, that is to say, each one of the resistive memory cells is connected to a first current line in a one-to-one-relationship. Further in above configuration, the plurality of selection transistors has gates and drain-source paths, with each drain-source path being connected to a multiplicity of resistive memory cells of a part or the whole of a row of the memory matrix. Here, the term "multiplicity" denotes a number of more than one resistive memory cell, which preferably comprises 4 or 8 resistive memory cells, and also preferable, may comprise all resistive memory cells of a row of the configuration.

Yet further in above configuration, the drain source paths of different selection transistors, each one of which is connected to a multiplicity of resistive memory cells, as above-described, are connected to a fourth current line, which may be denoted as "sense line" (SL). Hence, the drain source—source path of each one of the selection transistors is connected to the above-cited multiplicity of resistive memory cells, being comprised of a part or all resistive memory cells of a row of the memory matrix form, on the one hand, and is connected to the fourth current line, on the other hand. More specifically, the drains of the selection transistors are connected to the multiplicity of resistive memory cells, while its sources are connected to the fourth current line, or alternatively, the sources of the selection transistors are connected to the multiplicity of resistive memory cells, while its drains are connected to the fourth current line.

Yet further in above configuration, the gates of the selection transistors respectively are connected to one of the third current lines for their switching-on or switching-off, which third current lines may be identified by read word lines (RWL).

In a typical and preferred embodiment of the invention, the second current lines cross the first current lines preferably at right angles, while, also typical, the third current lines are designed to be in a parallel relationship to the second current lines. According to the invention, it may also be preferred, if the fourth current line is in a parallel relationship to the first current lines.

According to embodiments of the invention, the above configuration of resistive memory cells is realized as an MRAM-configuration comprising magneto-resistive memory cells, in which each one of the magneto-resistive memory cells contains a magnetic tunnel junction (MTJ), which typically includes first and a second magnetic layers, being made of magnetic material, and are stacked in parallel, overlying relationship and separated by a layer of nonmagnetic material. In such MTJ, the second magnetic layer is provided with a magnetically fixed magnetization, while the first magnetic layer is provided with a free magnetization being free to be switched between the same and opposite directions with respect to the fixed magnetization direction of the second magnetic layer.

According to a further embodiment, the present invention pertains to a method for sensing the resistance values of a selected ("addressed") resistive memory cell of the above configuration of resistive memory cells. Such method comprises pretensioning of the first current lines and the fourth current line to a predetermined first potential value ($V_{CM}$), that is to say the current lines are kept on that fixed potential value; then, switching-on of the selection transistor being connected to the resistive memory cell to be read by means of the third current line being connected to the gate of the selection transistor being connected to the addressed resistive memory cell, while all remaining selection transistors are kept in their off-states by means of their associated third current lines (the above selection transistor has to be chosen to be large enough to keep the local storage node of the resistive memory cell to be read at the predetermined first potential value ($V_{CM}$) in the selection transistor's ON-state); then applying of a predetermined second electrical potential ($V_{CM}+\delta V$) having a potential difference ($\delta V$) as to said predetermined first potential value ($V_{CM}$) on one of the first current lines being connected to the resistive memory cell to be read, while keeping the remaining first current lines and the fourth current line at the predetermined first potential value ($V_{CM}$); and determination of the height of a current flowing through said fourth current line, that is to say, a current flowing through a current path comprised of the first current line having applied the predetermined second potential ($V_{CM}+\delta V$), the resistive memory cell to be read, the selection transistor being connected to the resistive memory cell to be read and the fourth current line, which current depends on the predetermined second potential ($V_{CM}+\delta V$) and the resistance value of the resistive memory cell to be read. For pretensioning the fourth current line and the first current lines to a predetermined first potential value ($V_{CM}$), the above configuration further comprises means for pretensioning the fourth current line and the first current lines to a predetermined first potential value ($V_{CM}$).

As can be gathered from the foregoing, "addressing" or "selecting" of a single resistive memory cell in above configuration is effected by the cumulative action of applying the predetermined second electrical potential to one of the first current lines being connected to the resistive memory cell to be read and switching-on of the selection transistor being connected to the resistive memory cell to be read.

In a preferred embodiment of the method for sensing the resistance values of a selected resistive memory cell, the fourth current line is pretensioned to a predetermined third potential value ($V'_{CM}$) while the first current lines are pretensioned to the predetermined first potential value ($V_{CM}$), wherein the third potential value ($V'_{CM}$) is chosen to be smaller than the predetermined first potential value ($V_{CM}$) in order to compensate for ohmic losses of the selection transistor being connected to the selected resistive memory cell. Now referring to FIGS. 1 and 2 an embodiment of an MRAM-configuration 1 of the invention comprising magneto-resistive memory cells 2 in a memory matrix, wherein the first current lines define the columns of the memory matrix, while the second current lines define its rows, is explained. A MRAM-configuration is illustrated with first and second current lines (only one of the latter ones is shown in FIG. 1) along bit lines (BL0, BL1, BL2, BL3) and write word lines (WWL), respectively, each magnetic memory cell 2 of the invention's MRAM-configuration comprises a magnetic tunnel junction (MTJ), which includes free 3 and reference 4 layers made of a magnetic material stacked in parallel, overlying relationship and separated by a layer of nonmagnetic material 5. The magnetization of the free layer is magnetically coupled to a bit line above the corresponding MTJ and a write word line below that MTJ for its switching in a parallel or antiparallel state with respect to the magnetization of the reference layer. Bit lines and write word lines are crossing at right angles, while each one of the MTJs is positioned at their intersections. The bit lines generate a first magnetic field in case a current is sent therethrough. Also, write word lines generate a second magnetic field in case a current is sent therethrough. Both magnetic fields mutually act on the easy axis magnetization of the MTJ positioned at the intersection of the corresponding bit and write word lines, respectively, for its switching.

Figure 2:
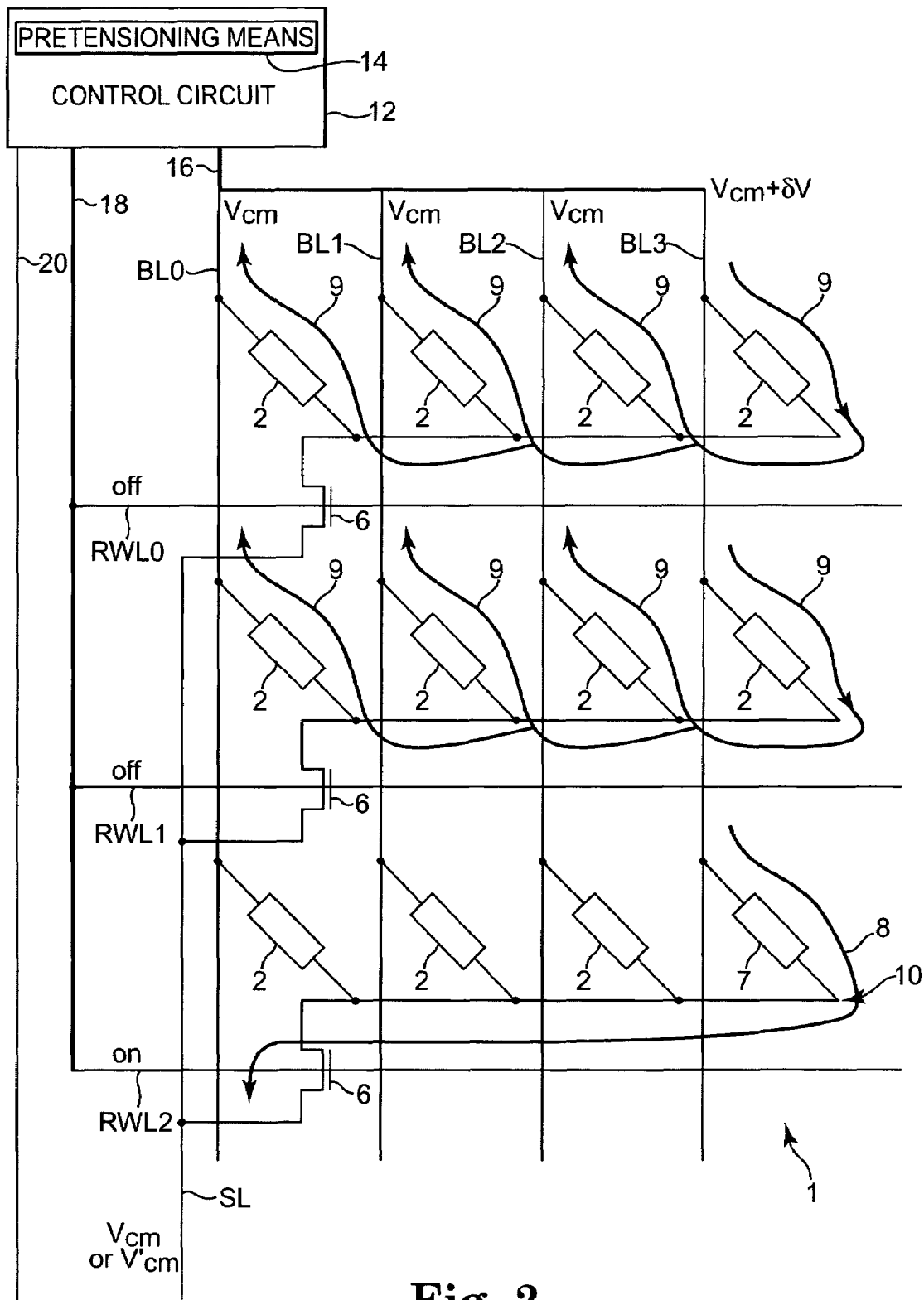
FIG. 2 is a schematic top-down view onto one layer of a memory matrix of the embodiment shown in FIG. 1 particularly for illustrating the method for sensing resistance values of a selected memory cell.
Figure 3:
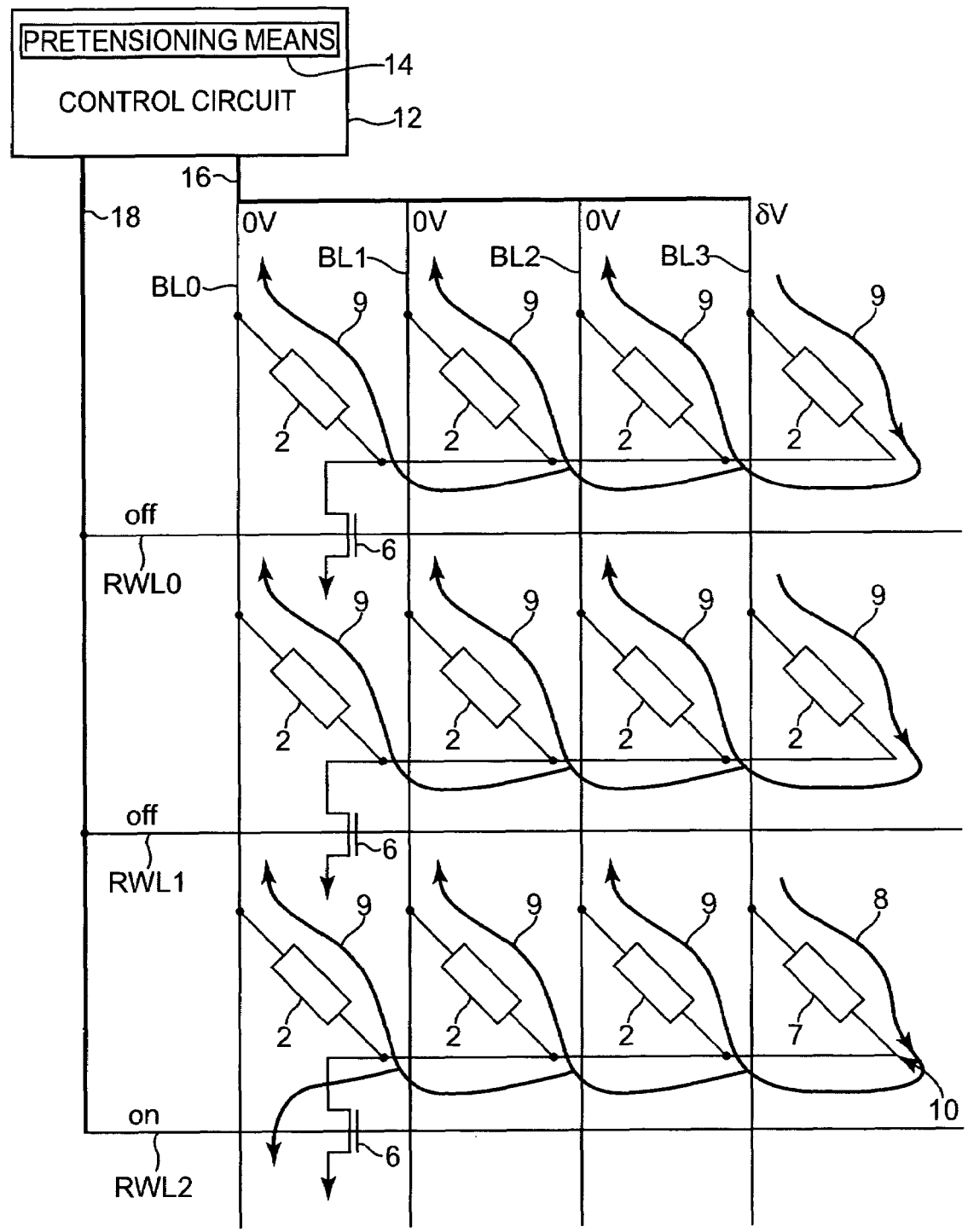
FIG. 3 is another schematic top-down view onto the layer shown in FIG. 2 without having the selection transistors connected to the sense line.

In FIGS. 1 and 2, each one of the magneto-resistive memory cells 2 is electrically connected to a separate bit line, wherein a multiplicity of 4 memory cells of a row of the memory matrix being connected to different bit lines are electrically connected to the source-drain path of only a single selection transistor 6. The source-drain path of the selection transistor 6 is also electrically connected to a sense line (SL) for sensing the resistance values of selected magneto-resistive memory cells of the multiplicity of memory cells connected therewith. The selection transistor's 6 gate is electrically connected to a read word line (RWL0) for switching on or off of the selection transistor. As can be taken from FIG. 2, each one of the read word lines (RWL0, RWL1, RWL2) is in a parallel relationship to the write word lines (WWL), while the sense line (SL) is in a parallel relationship to the bit lines (BL0, BL1, BL2, BL3), and, each one of the plural selection transistors 6 respectively being connected to a multiplicity of memory cells is connected to the sense line (SL). The sense line (SL) is electrically connected to control circuit 12, which includes pretensioning means 14, through path 20. In FIGS. 2 and 3, the bit lines (BL0, BL1, BL2, BL3) are electrically connected to control circuit 12 through path 16, and the read word lines (RWL0, RWL1, RWL2) are electrically connected to control circuit 12 through path 18.

Now particularly referring to FIGS. 2 and 3, wherein FIG. 2 shows a schematic top-down view onto one layer of the memory matrix of the embodiment shown in FIG. 1 and FIG. 3 shows a schematic top-down view onto the layer shown in FIG. 2 without having the selection transistors connected to the sense line, a method for sensing resistance values of a selected memory cell is given.

While writing into a selected magneto-resistive memory cell, that is to say storing digital information, can be effected in convenient manner by sending respective currents through the bit and write word lines having the memory cell at their intersection, in order to properly achieve a read, that is to say sensing of resistance values of a selected memory cell 7, all bit lines and the sense line are initially pretensioned (precharged) to a predetermined first potential value ($V_{CM}$), while all selection transistors 6 are in their OFF-states. The access (selection or addressing) starts by switching-on the selection transistor being connected to the memory cell 7 to be read, that is to say the selection transistor is brought from its OFF-state into its ON-state. If the selection transistor would be perfect (ON-resistance=0), then the local storage node 10 at the memory cell 7 to be read remains at the predetermined first potential value ($V_{CM}$) in case the selection transistor is switched-on and there will be no leakage path (parasitic currents) through the unselected memory cells 2 of the same storage node 10, that is to say all memory cells connected to that selection transistor apart from that one to be read, since there is no voltage difference applied on these memory cells 2.

Then, a predetermined second potential (VCM+δV) having a potential difference (δV) as to the predetermined first potential value ($V_{CM}$) is applied on one (BL3) of the bit lines being connected to the memory cell 7 to be read, while keeping all remaining bit lines (BL0, BL1, BL2) and the sense line (SL) at the predetermined first potential value ($V_{CM}$). All memory cells along the bit line (BL3) having an electrical signal applied leak some parasitic current 9, however, on the row selected by the ON-state of the selection transistor 6, as the storage node 10 is kept at the same potential value (i.e., predetermined first potential value ($V_{CM}$)) as the unseleceted bit lines all the sense current 8 flowing through the selected memory cell 7 also goes through the selection transistor, i.e., on the sense line (SL). Hence, sensing of the resistance values of the selected memory cell 7 can be done on the sense line (SL) by determination of the height of the sense current 8 flowing therethrough.

Since, in practice, the selection transistor is not a perfect switch and has some residual electrical resistance while turned on, which depends on the dimension of the transistor as a function of its reciprocal width, such ohmic losses should be compensated by setting the predetermined first potential value ($V_{CM}$) to a predetermined third potential value ($V'_{CM}$), which is chosen to be smaller, typically slightly smaller, than the predetermined first potential value ($V_{CM}$).

As can be taken from FIG. 3, in a situation having the selection transistors respectively connected to ground instead of being connected to a common sense line, and having all bit lines connected to ground apart from the bit line being connected to the memory cell to be read and having applied a potential different from zero potential, parasitic leakage currents flow through the memory cells connected to that bit line and also flow through the unselected memory cells of the multiplicity of memory cells connected to the selection transistor. A sensing of resistance values of a selected memory cell thus is prevented.

The present invention solves the above and further needs. In layout realization, it is possible to use the same process flow as in the production of prior art resistive memory cell configurations. However, instead of being limited in the memory cell size to 20–25 $F^2$ due to selection transistor limitations, as above-described, a multiplicity of 4 or 8 memory cells connected to a single selection transistor will end up with a minimum area per memory cell of as small as 9.1 $F^2$. Parasitic currents in the unselected memory cells connected to that selection transistor advantageously can be avoided.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A configuration of resistive memory cells comprising:
   a plurality of first current lines;
   a plurality of second current lines;
   a plurality of third current lines;
   a plurality of resistive memory cells being disposed in a memory matrix form between the first and second current lines, the first current lines defining the columns of the memory matrix, while the second current lines defining the rows of it, wherein each one of the resistive memory cells being connected to one of the first current lines;
   a plurality of selection transistors having gates and drain-source paths, each drain-source path of the selection transistors being connected to a multiplicity of the resistive memory cells of a row of the memory matrix, the drain-source paths of different selection transistors being connected to a fourth current line, the gates of the selection transistors of a row of the memory matrix form being connected to one of the third current lines; and
   a control circuit configured to sense a resistance of a selected memory cell by:
      pretensioning the plurality of first current lines and the fourth current line to a predetermined first potential value;
      switching on the selection transistor connected to the selected memory cell;
      applying a predetermined second potential value to the first current line connected to the selected memory cell, the predetermined second potential value having a potential difference as to the predetermined first potential value; and
      determining a height of a sense current flowing through the fourth current line.

2. The memory cells of claim 1, wherein the second current lines cross the first current lines at right angles.

3. The memory cells of claim 1, wherein the third current lines are in a parallel relationship to second current lines.

4. The memory cells of claim 1, wherein the fourth current line is in a parallel relationship to the first current lines.

5. The memory cells of claim 1, wherein the multiplicity of resistive memory cells consists of 4 resistive memory cells.

6. The memory cells of claim 1, wherein the multiplicity of resistive memory cells consists of 8 resistive memory cells.

7. The memory cells of claim 1, wherein the multiplicity of resistive memory cells is comprised of all resistive memory cells of a row of the memory matrix form.

8. The memory cells of claim 1, wherein the configuration is an MRAM configuration comprising magneto-resistive memory cells each one containing a magnetic tunnel junction (MTJ) including first and a second magnetic layers made of magnetic material stacked in parallel, overlying relationship and separated by a layer of nonmagnetic material, the second magnetic layer being provided with a magnetically fixed magnetization, while the first magnetic layer being provided with a free magnetization being free to be switched between the same and opposite directions with respect to the fixed magnetization direction of the second magnetic layer.

9. A method for sensing the resistance value of a selected resistive memory cell to be read, comprising:
   pretensioning of first current lines and a fourth current line to a predetermined first potential value;
   switching-on of a selection transistor being connected to a resistive memory cell to be read, while all remaining selection transistors are kept in their off-states;
   application of a predetermined second electrical potential having a potential difference as to the predetermined first potential on one of the first current lines being connected to the resistive memory cell to be read, while keeping all remaining first current lines and the fourth current line at the predetermined first potential value; and
   determination of the height of a current flowing through the fourth current line.

10. The method of claim 9, wherein the fourth current line is pretensioned to a predetermined third potential value, while the first current lines are pretensioned to the predetermined first potential value, wherein the second potential value is chosen to be smaller than the predetermined first potential value in order to compensate for ohmic losses of the selection transistor.

11. An array of resistive magnetic memory cells comprising:
   a plurality of first current lines;
   a plurality of second current lines;
   a plurality of third current lines;
   a plurality of magnetic memory cells being disposed in a memory matrix form between the first and second current lines, the first current lines defining the columns of the memory matrix, while the second current lines defining the rows of it, wherein each one of the magnetic memory cells being connected to one of the first current lines;

a plurality of selection transistors having gates and drain-source paths, each drain-source path of the selection transistors being connected to a multiplicity of the magnetic memory cells of a row of the memory matrix, the drain-source paths of different selection transistors being connected to a fourth current line, the gates of the selection transistors of a row of the memory matrix form being connected to one of the third current lines; and a control circuit configured to sense a resistance of a selected memory cell by:
- pretensioning the plurality of first current lines and the fourth current line to a predetermined first potential value;
- switching on the selection transistor connected to the selected memory cell;
- applying a predetermined second potential value to the first current line connected to the selected memory cell the predetermined second potential value having a potential difference as to the predetermined first potential value; and
- determining a height of a sense current flowing through the fourth current line.

12. The memory cells of claim 11, wherein the second current lines cross the first current lines at right angles; and wherein the third current lines are in a parallel relationship to second current lines.

13. The memory cells of claim 12, wherein the fourth current line is in a parallel relationship to the first current lines.

14. The memory cells of claim 12, wherein the multiplicity of resistive memory cells consists of 4 resistive memory cells.

15. The memory cells of claim 12, wherein the multiplicity of resistive memory cells consists of 8 resistive memory cells.

16. The memory cells of claim 12, wherein the multiplicity of resistive memory cells is comprised of all resistive memory cells of a row of the memory matrix form.

17. A method for sensing a resistance value of a selected memory cell, the method comprising:
- precharging bit lines and a sense line to a first potential value;
- turning on a selection transistor connected between a selected memory cell and the sense line;
- applying a second potential value to the bit line connected to the selected memory cell while maintaining the first potential value on the other bit lines, the second potential value greater than the first potential value; and
- sensing a resistance value of the selected memory cell based on a signal on the sense line.

18. The method of claim 17, wherein sensing a resistance value of the selected memory cell comprises determining the resistance value based on a current flowing through the sense line.

19. The method of claim 17, wherein the selected memory cell comprises a magnetic memory cell.

20. The method of claim 17, wherein the selected memory cell comprises a phase change memory cell.

* * * * *